US012588541B2

(12) United States Patent
Wu et al.

(10) Patent No.: US 12,588,541 B2
(45) Date of Patent: Mar. 24, 2026

(54) FLIP CHIP BONDING METHOD AND CHIP USED THEREIN

(71) Applicant: CHIPBOND TECHNOLOGY CORPORATION, Hsinchu (TW)

(72) Inventors: Fei-Jain Wu, Hsinchu County (TW); Sheng-Jen Wu, Hsinchu County (TW); Hsueh-Shun Yeh, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 579 days.

(21) Appl. No.: 18/078,170

(22) Filed: Dec. 9, 2022

(65) Prior Publication Data

US 2023/0326894 A1      Oct. 12, 2023

(30) Foreign Application Priority Data

Apr. 7, 2022    (TW) .................................. 111113337

(51) Int. Cl.
H10W 74/01          (2026.01)
H10W 72/00          (2026.01)
         (Continued)

(52) U.S. Cl.
CPC ......... H10W 74/012 (2026.01); H10W 74/15 (2026.01); H10W 72/07232 (2026.01); (Continued)

(58) Field of Classification Search
None
See application file for complete search history.

(56) References Cited

U.S. PATENT DOCUMENTS 7,390,732 B1 *   6/2008   Watanabe ............... H01L 24/11
                                                    257/E23.021
2003/0183951 A1 *  10/2003  Achari .................... H01L 24/11
                                                    257/E23.068
(Continued)

FOREIGN PATENT DOCUMENTS

JP        2005-340761 A      12/2005
JP        2005-353983 A      12/2005
                 (Continued)

OTHER PUBLICATIONS

Korean office action mailed Aug. 14, 2024 for Korean Patent Application No. 10-2022-0172540, 11 pages.
(Continued)

*Primary Examiner* — Julio J Maldonado
*Assistant Examiner* — Pinaki Das
(74) *Attorney, Agent, or Firm* — Demian K. Jackson; Jackson IPG PLLC

(57)          ABSTRACT

In a bonding process of a flip chip bonding method, a chip is bonded to contact pads of a substrate by composite bumps which each includes a raiser, a UBM layer and a bonding layer. Before the bonding process, the surface of the bonding layer facing toward the substrate is referred to as a surface to be bonded. During the bonding process, the surface to be bonded is boned to the contact pad and become a bonding surface on the contact pad. The bonding surface has an area greater than that of the surface to be bonded so as to reduce electrical impedance between the chip and the substrate.

5 Claims, 13 Drawing Sheets

(51) Int. Cl.

| | | |
|---|---|---|
| *H10W 72/20* | (2026.01) | |
| *H10W 72/29* | (2026.01) | |
| *H10W 72/90* | (2026.01) | |
| *H10W 74/15* | (2026.01) | |
| *H10W 90/00* | (2026.01) | |

(52) U.S. Cl.
CPC .... *H10W 72/07332* (2026.01); *H10W 72/221* (2026.01); *H10W 72/223* (2026.01); *H10W 72/234* (2026.01); *H10W 72/235* (2026.01); *H10W 72/245* (2026.01); *H10W 72/253* (2026.01); *H10W 72/29* (2026.01); *H10W 72/90* (2026.01); *H10W 72/921* (2026.01); *H10W 72/923* (2026.01); *H10W 72/934* (2026.01); *H10W 90/724* (2026.01); *H10W 90/734* (2026.01)

(56) References Cited

U.S. PATENT DOCUMENTS

| | | | | |
|---|---|---|---|---|
| 2003/0222348 A1 * | 12/2003 | Okada | .................... | H01L 24/03 |
| | | | | 257/758 |
| 2007/0210457 A1 | 9/2007 | Lin et al. | | |

| | | | | |
|---|---|---|---|---|
| 2009/0057887 A1 * | 3/2009 | Mclellan | ................. | H01L 24/94 |
| | | | | 257/737 |
| 2011/0230044 A1 | 9/2011 | Chang et al. | | |
| 2011/0266670 A1 * | 11/2011 | England | ................ | H01L 23/562 |
| | | | | 257/773 |
| 2012/0319271 A1 * | 12/2012 | Shih | ........................ | H01L 24/03 |
| | | | | 257/737 |
| 2021/0249374 A1 * | 8/2021 | Hashino | ................. | H01L 23/13 |

FOREIGN PATENT DOCUMENTS

| | | | |
|---|---|---|---|
| KR | 10-2006-0046431 A | 5/2006 | |
| TW | 201017841 A | 5/2010 | |
| TW | 201133748 A | 10/2011 | |
| TW | I436461 B | 5/2014 | |

OTHER PUBLICATIONS

Japanese Office Action mailed Feb. 14, 2024 for Japanese Patent Application No. 2022-197945, 8 pages.

Taiwanese Office Action mailed May 2, 2023 for Taiwanese Patent Application No. 111113337, 3 pages.

\* cited by examiner

10

14    13    14    14

16    12    16    12    11    16    15    12

FLIP CHIP BONDING METHOD AND CHIP USED THEREIN

FIELD OF THE INVENTION

This invention relates to a flip chip bonding method, and more particularly to a method of bonding a chip to a substrate using composite bumps.

BACKGROUND OF THE INVENTION

In a conventional flip-chip package 10 as shown in FIG. 1, bumps 14 of a chip 13 are electrically connected to contact pads 16 of a substrate 15 by conductive particles 12 in an anisotropic conductive film (ACF) 11. The area of the conductive particles 12 contacting the bumps 14 and the contact pads 16 is small so as to increase electrical impedance between the chip 13 and the substrate 15 and lower effectiveness and reliability of the conventional flip-chip package 10.

SUMMARY

One object of the present invention is to provide a flip chip bonding method and a chip used therein, which is able to reduce electrical impedance between a chip and a substrate.

A flip chip bonding method of the present invention includes the steps of providing a substrate and a chip and performing a bonding process. The substrate includes contact pads, the chip includes a body, bond pads, a protective layer and composite bumps. The bond pads are arranged on the body, the protective layer covers a surface of the body and includes openings each exposes one of the bond pads. Each of the composite bumps is electrically connected to one of the bond pads and includes a raiser, a UBM layer and a bonding layer. The raiser is non-conductive and covered by the UBM layer, the UBM layer is electrically connected to the bond pads, the bonding layer covers the UBM layer and is electrically connected to the UBM layer, the bonding layer located over the raiser has a surface to be bonded which faces toward the substrate. During the bonding process, the composite bumps of the chip are bonded to the contact pads of the substrate, the surface to be bonded of the bonding layer of each of the composite bumps contacts one of the contact pads to become a bonding surface on each of the contact pads. The bonding surface has an area greater than that of the surface to be bonded.

A chip of the present invention includes a body, bond pads, a protective layer and composite bumps. The bond pads are arranged on the body, the protective layer covers a surface of the body and includes openings each exposing one of the bond pads, each of the composite bumps is electrically connected to one of the bond pads and includes a raiser, a UBM layer and a bonding layer. The raiser is non-conductive and covered by the UBM layer, the UBM layer is electrically connected to the bond pads, the bonding layer covers the UBM layer and is electrically connected to the UBM layer. The bonding layer is provided to be electrically connected to a contact pad of a substrate.

After bonding the composite bumps to the contact pads, the bonding surface of the bonding layer contacting the contact pads has an area greater than that of the surface to be bonded of the bonding layer, thus the bonding area of each of the composite bumps contacting each of the contact pads is increased to lower electrical impedance between the chip and the substrate and further ensure effectiveness and reliability of the flip-chip package.

DETAILED DESCRIPTION OF THE INVENTION

Figure 1:
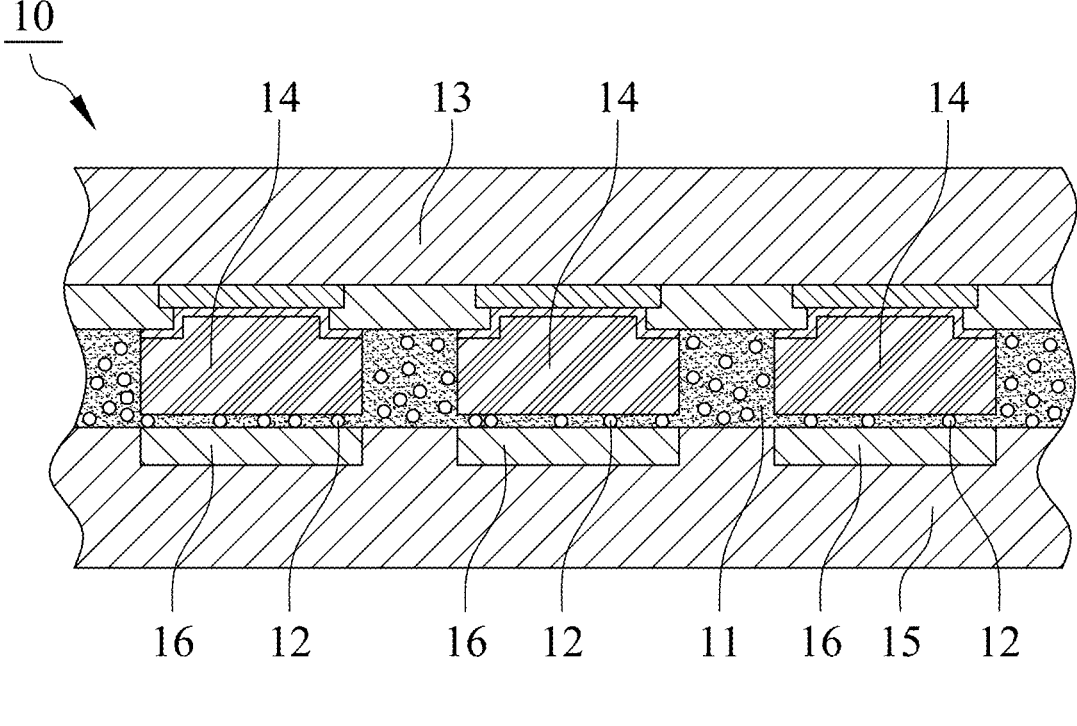
FIG. 1 is a cross-section view diagram illustrating a conventional flip-chip package.

With reference to FIGS. 2 to 5, a flip chip bonding method in accordance with a first embodiment of the present invention includes the steps of providing a chip 100, providing a substrate 200 and a bonding process. The substrate 200, which may be a glass substrate, can be provided before or after the step of providing the chip 100, and can be provided together with the chip 100. During the bonding process, the chip 100 is bonded to contact pads 210 of the substrate 200.

With reference to FIGS. 2 to 5, the chip 100 includes a body 110, a plurality of bond pads 120, a protective layer 130 and a plurality of composite bumps 140. The bond pads 120 are arranged on the body 110, the protective layer 130 covers a surface 111 of the body 110 and includes a plurality of openings 131, each of the bond pads 120 is visible from one of the openings 131. In the first embodiment, each of the composite bumps 140 is a pyramid or cone extended in a direction Y vertical to the body 110.

Figure 2:
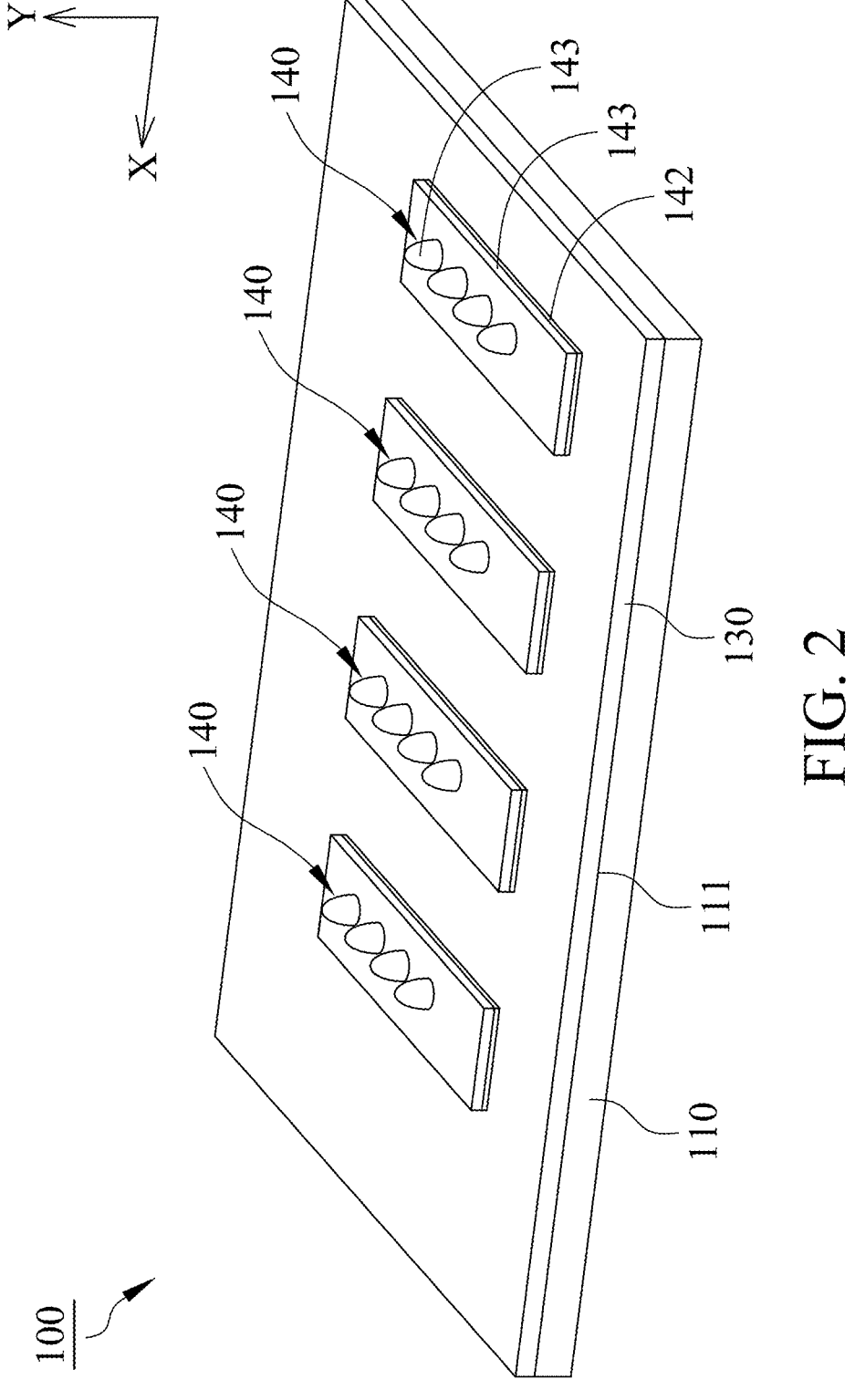
FIG. 2 is a perspective diagram illustrating a chip in accordance with a first embodiment of the present invention.
Figures 3A, 3B:
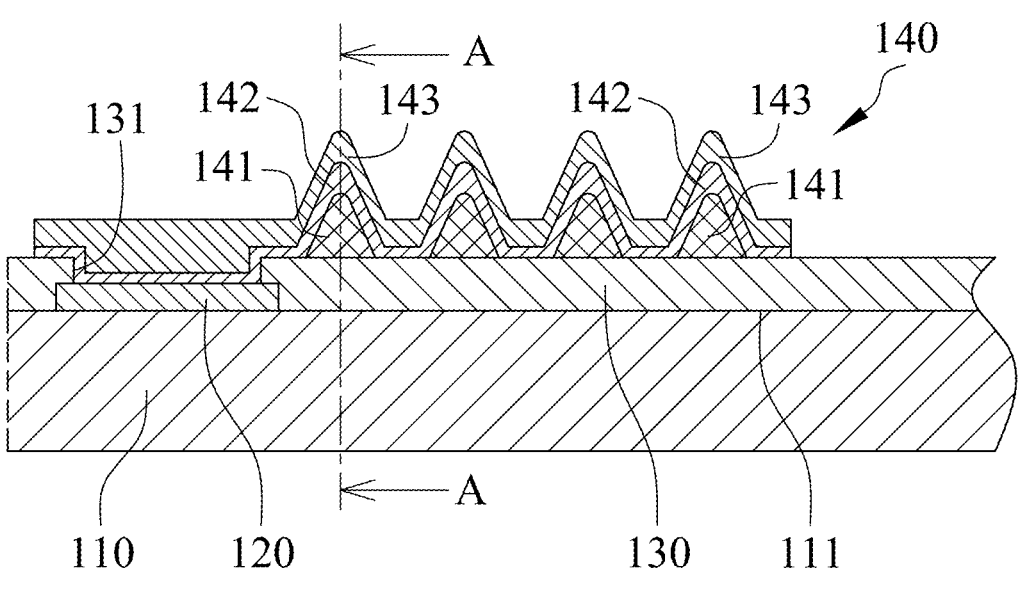
FIG. 3A is a cross-section view diagram of FIG. 2.
FIG. 3B is a cross-section view diagram along A-A line of FIG. 3A.

With reference to FIGS. 2, 3A and 3B, each of the composite bumps 140 is electrically connected to one of the bond pads 120 and includes at least one raiser 141, a UBM (under bump metallization) layer 142 and a bonding layer 143. The raiser 141 is a nonconductive body which may be made of polymer material. In the first embodiment, each of the composite bumps 140 includes a plurality of raisers 141, each of the raisers 141 is a pyramid or cone extended in the direction Y and is located on the protective layer 130.

With reference to FIGS. 2, 3A and 3B, the UBM layer 142 covers the raisers 141 and is electrically connected to the bond pad 120. And preferably, the raisers 141 are fully covered by the UBM layer 142. The UBM layer 142 can be made of titanium (Ti), tungsten titanium (TiW), copper (Cu), nickel (Ni), gold (Au) or nickel vanadium (NiV).

Figures 4, 5:
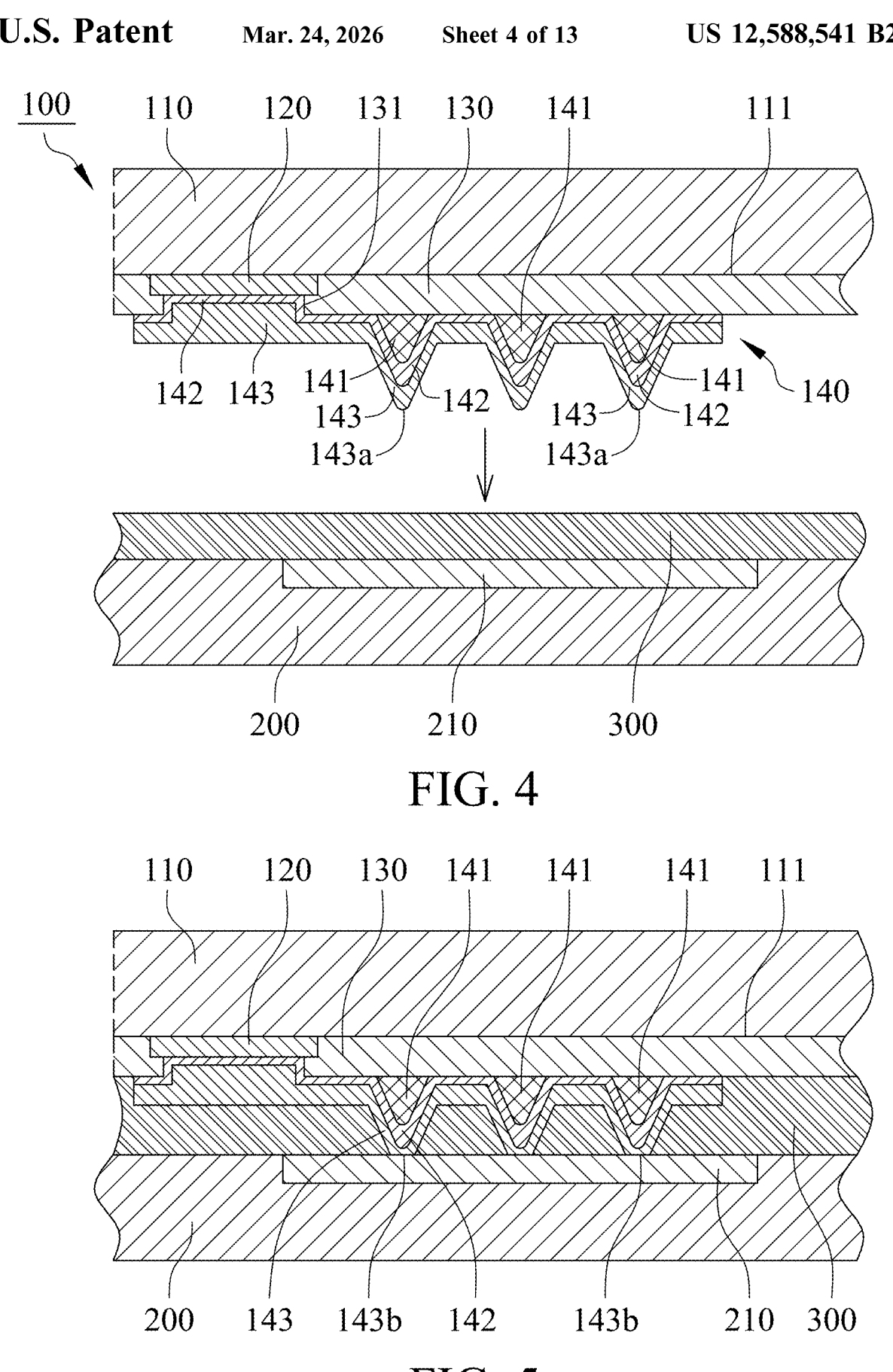
FIG. 4 is a cross-section view diagram illustrating a chip bonded to a substrate in accordance with a first embodiment of the present invention.
FIG. 5 is a cross-section view diagram illustrating a chip bonded to a substrate in accordance with a first embodiment of the present invention.

The bonding layer 143 covers the UBM layer 142 and is electrically connected to the UBM layer 142. Preferably, the UBM layer 142 is fully covered by the bonding layer 143. The bonding layer 143 is provided to be electrically connected to the contact pad 210 of the substrate 200 and it can be made of gold (Au), copper (Cu), tin (Sn), gold/tin alloy (Au/Sn), tin-silver alloy (Sn/Ag), indium (In), bismuth/tin alloy (Bi/Sn) or tin/lead alloy (Sn/Pb). With reference to FIG. 4, before the bonding process, the bonding layer 143 located over the raiser 141 has a surface to be bonded 143a which faces toward the substrate 200.

With reference to FIG. 5, the composite bumps 140 on the chip 100 are bonded to the contact pads 210 on the substrate 200 in the bonding process. Each of the composite bumps 140 contacts one of the contact pads 210 via the surface to be bonded 143a of the bonding layer 143, and after the bonding process, the surface of the bonding layer 143 bonded to the contact pad 210 is referred to as a bonding surface 143b. The bonding surface 143b has an area greater than that of the surface to be bonded 143a such that electrical impedance between the chip 100 and the substrate 200 can be reduced.

With reference to FIGS. 4 and 5, in the first embodiment, a non-conductive film (NCF) 300 is provided between the substrate 200 and the chip 100 before the bonding process. And during the bonding process, the composite bumps 140 are provided to penetrate through the NCF 300 to allow the surface to be bonded 143a of the bonding layer 143 to contact the contact pads 210, the substrate 200 and the chip 100 are compressed continuously to allow the surface of the bonding layer 143 facing toward the contact pad 210 to become the bonding surface 143b and allow the NCF 300 to be filled between the substrate 200 and the chip 100 to cover the composite bumps 140.

Figure 6:
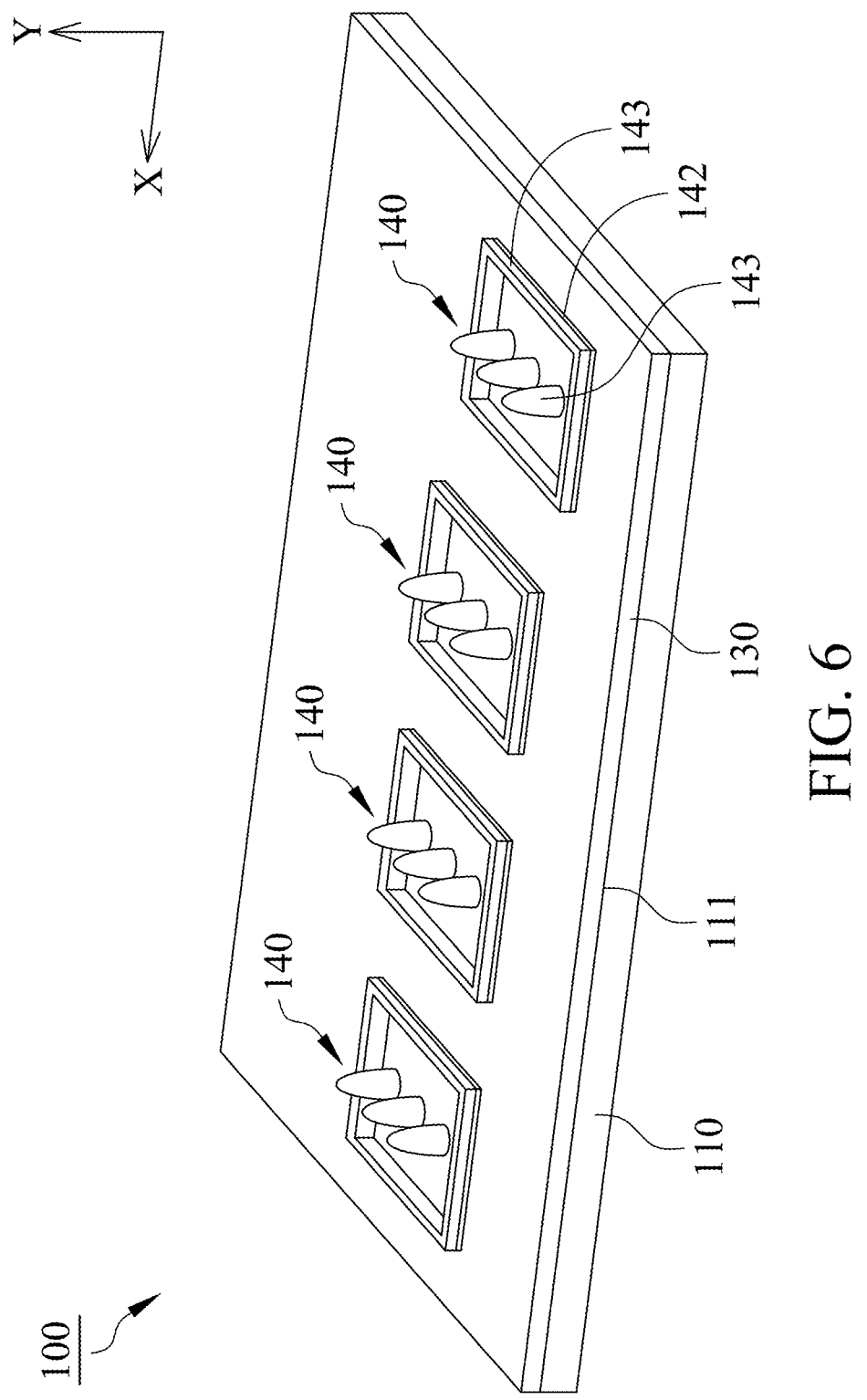
FIG. 6 is a perspective diagram illustrating a chip in accordance with a second embodiment of the present invention.
Figure 7A:
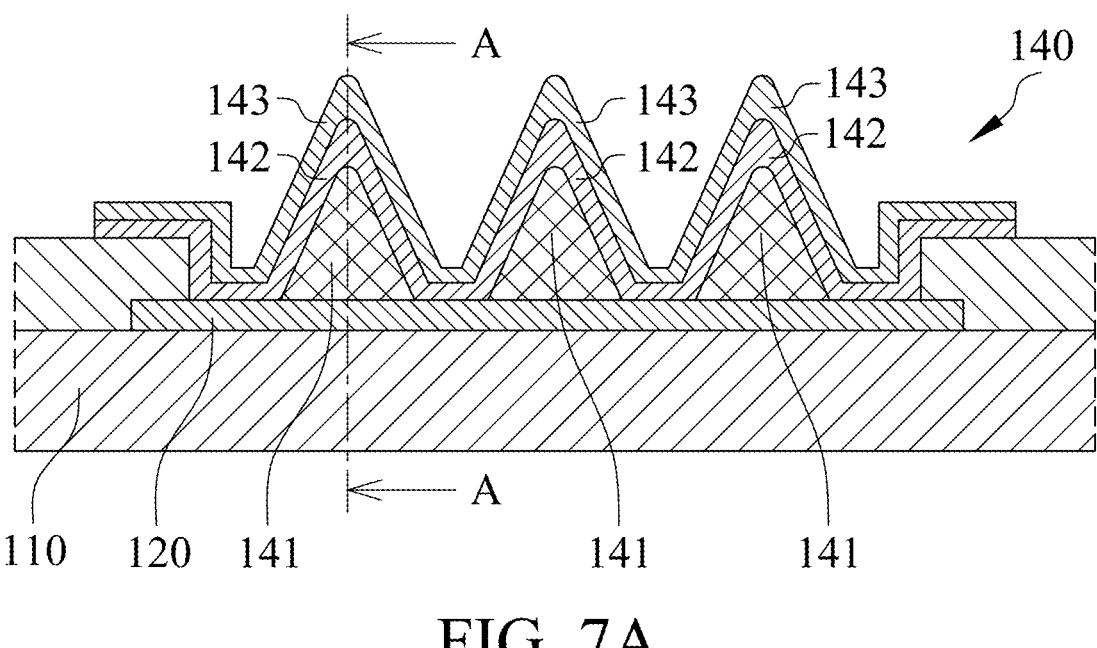
FIG. 7A is a cross-section view diagram of FIG. 6.
Figure 7B:
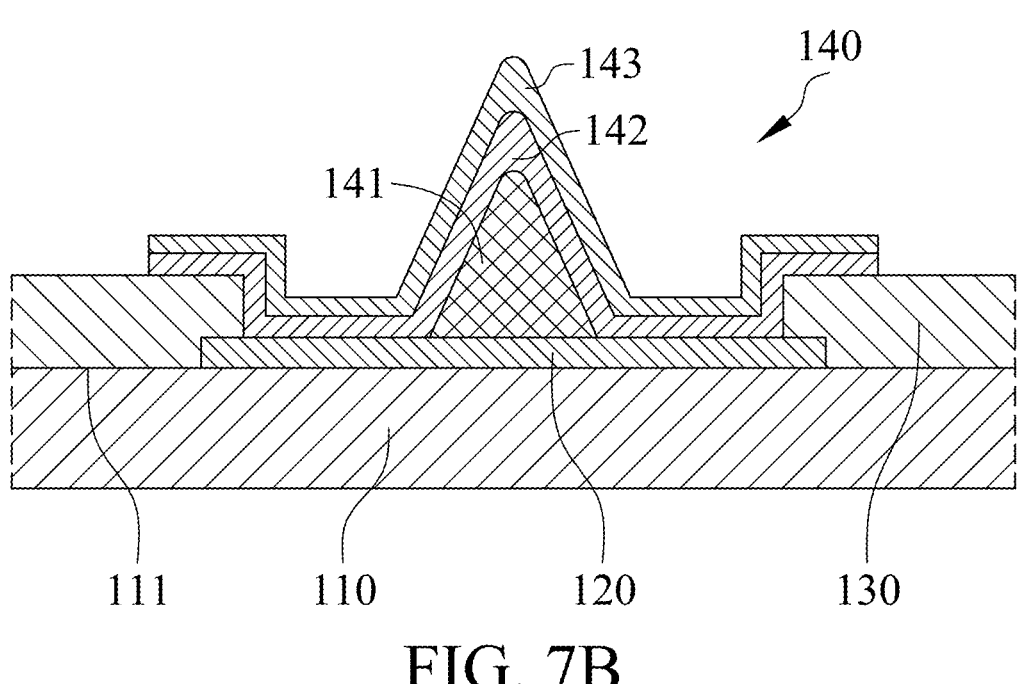
FIG. 7B is a cross-section view diagram along A-A line of FIG. 7A.

A second embodiment of the present invention is shown in FIGS. 6, 7A and 7B. Different to the first embodiment, the raisers 141 of each of the composite bumps 140 are disposed on the bonding pad 120 in the second embodiment, thus each of the composite bumps 140 is protruded from the bond pad 120.

Figure 8:
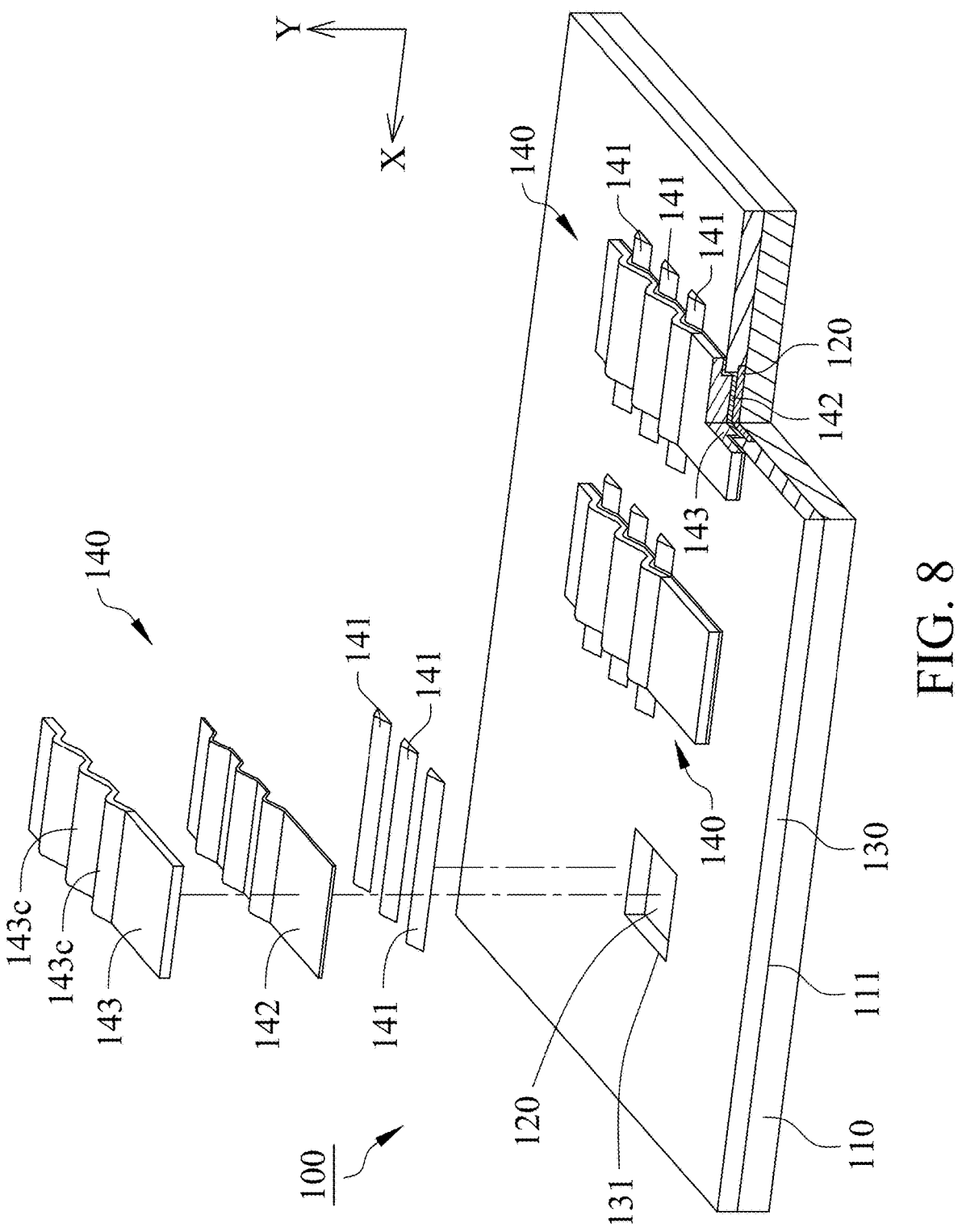
FIG. 8 is a perspective diagram illustrating a chip in accordance with a third embodiment of the present invention.
Figure 9A:
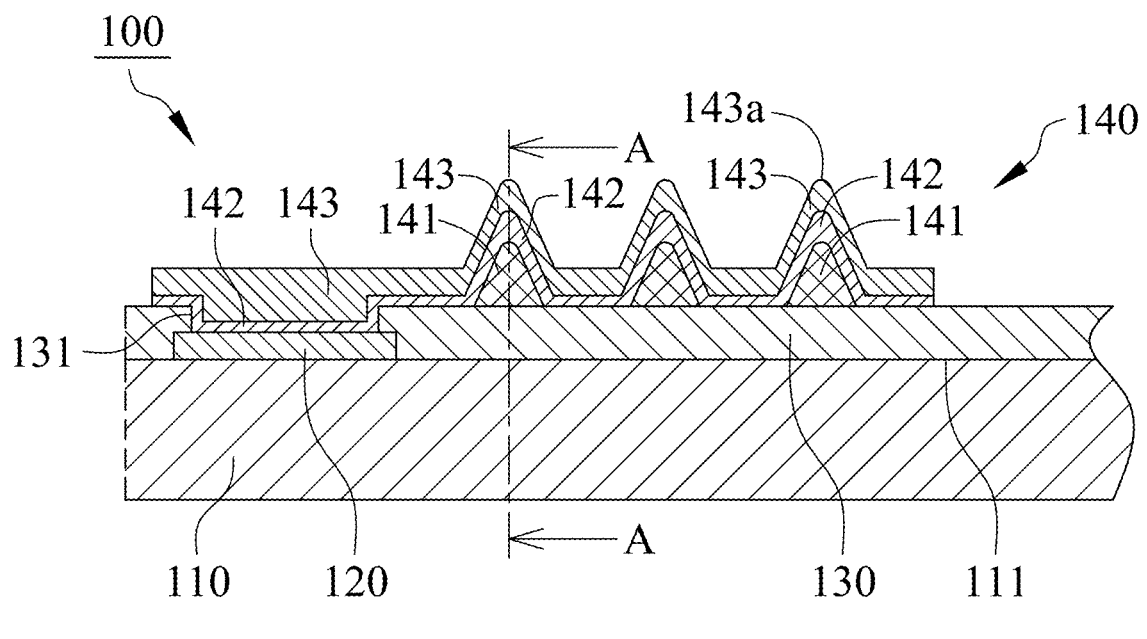
FIG. 9A is a cross-section view diagram of FIG. 8.
Figure 9B:
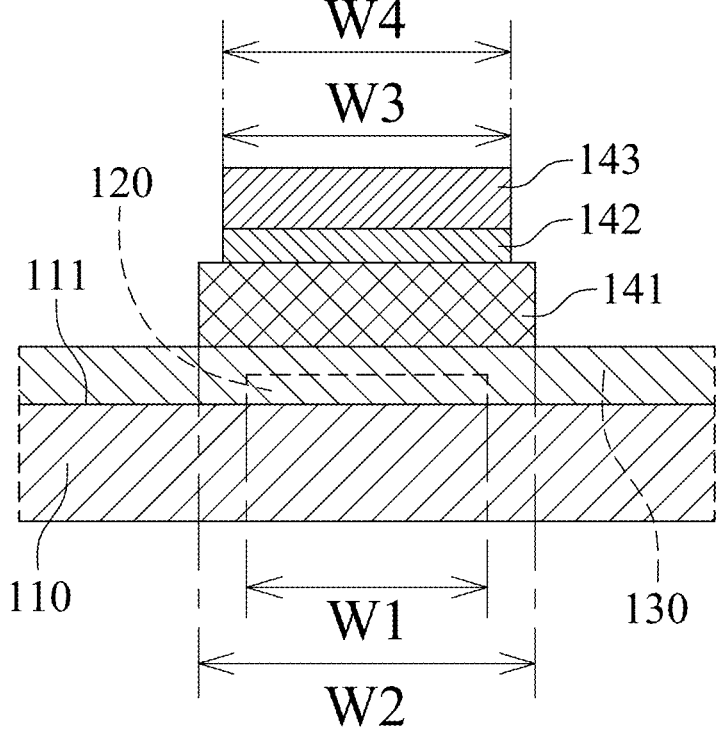
FIG. 9B is a cross-section view diagram along A-A line of FIG. 9A.

With reference to FIGS. 8, 9A and 9B, the raiser 141 of a third embodiment of the present invention is a rib-like raiser extended in a direction X substantially parallel to the surface 111 of the body 110. Along the direction X, each of the openings 131 of the protective layer 130 has a first width W1, and the raiser 141 has a second width W2 greater than or equal to the first width W1. The rib-like raiser 141 of the third embodiment can enhance compression strength of the chip 100 and distribute compressive stress in the chip 100 during the bonding process, so breaking of the chip 100 caused by stress concentration can be preventable.

Figure 10:
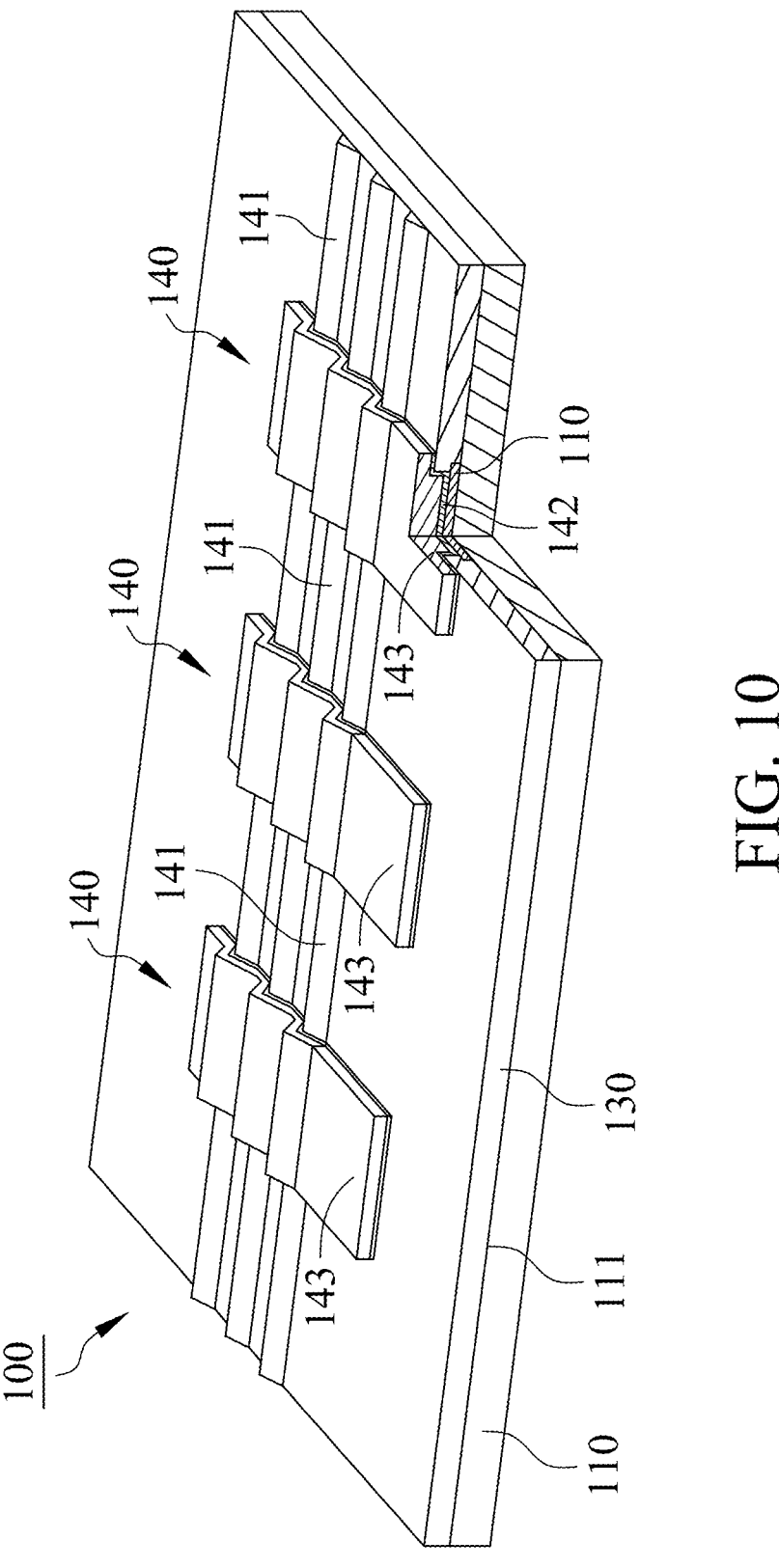
FIG. 10 is a perspective diagram illustrating a chip in accordance with one embodiment of the present invention.

With reference to FIGS. 8, 9A and 9B, in the third embodiment, the UBM layer 142 located on the raiser 141 has a third width W3 along the direction X parallel to the surface 111 of the body 110, the third width W3 is less than or equal to the second width W2 of the raiser 141. In another embodiment as shown in FIG. 10, the raiser 141 of one of the composite bumps 140 is connected to the raiser 141 of the adjacent composite bump 140 along the direction X, and the raisers 141 connected with each other become a raising strip formed as one piece.

In the third embodiment as shown in FIGS. 8, 9A and 9B, the bonding layer 143 located on the UBM layer 142 has a bonding rib 143c which has a fourth width W4 along the direction X, the fourth width W4 is greater than or equal to the third width W3 of the UBM layer 142 located on the raiser 141. The bonding rib 143c is electrically connected to the contact pad 210 and used to enhance bonding strength of the bonding layer 143 to the contact pad 210. Similarly, before the bonding process, the bonding rib 143c has a surface to be bonded facing toward the substrate 200, the surface to be bonded of the bonding rib 143c is used to contact the contact pad 210 during the bonding process and becomes a bonding surface of the bonding rib 143c on the contact pad 210 after the bonding process. The area of the bonding surface is greater than that of the surface to be bonded such that the electrical impedance between the chip 100 and the substrate 200 can be reduced.

Figure 11:
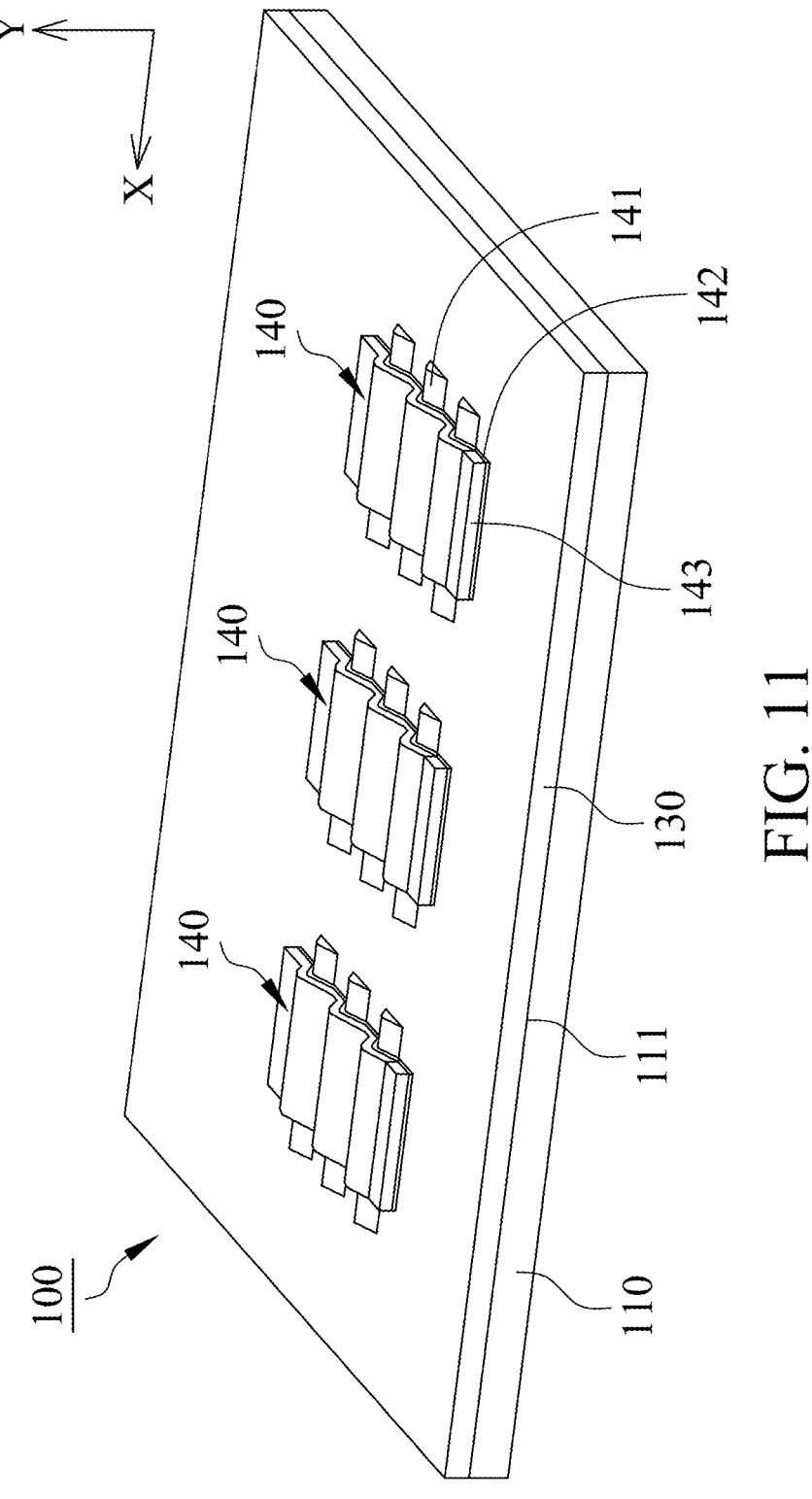
FIG. 11 is a perspective diagram illustrating a chip in accordance with a fourth embodiment of the present invention.
Figure 12A:
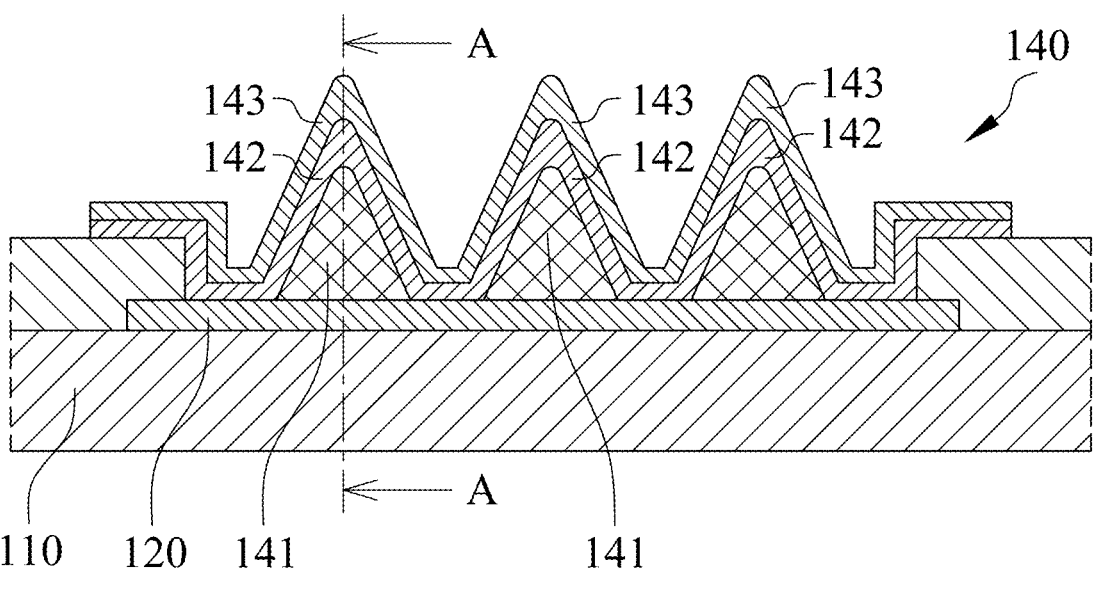
FIG. 12A is a cross-section view diagram of FIG. 11.
Figure 12B:
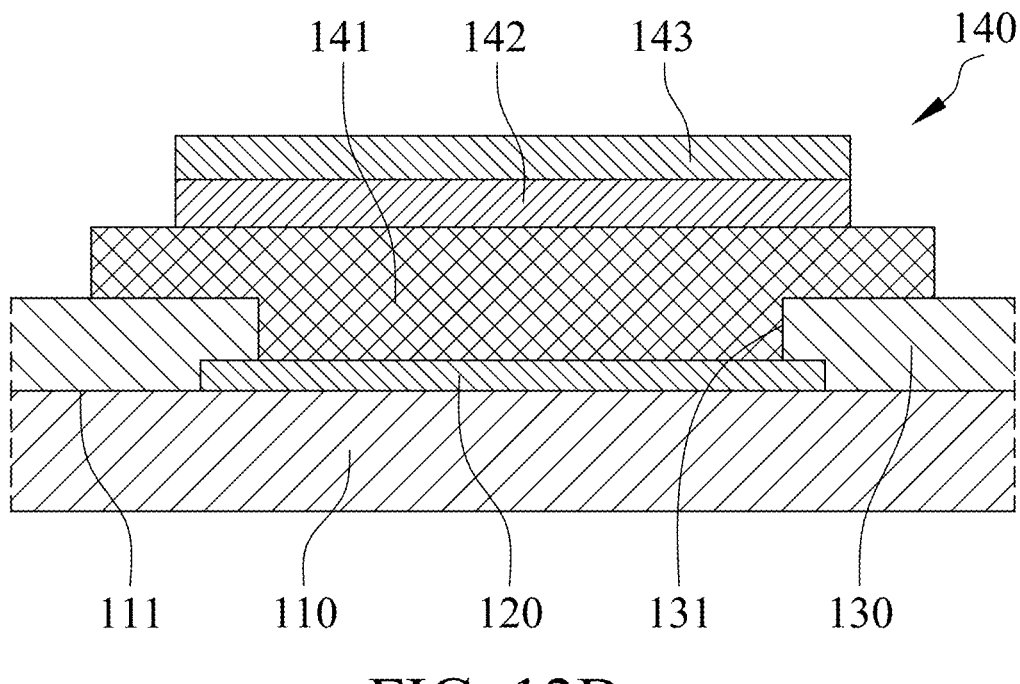
FIG. 12B is a cross-section view diagram along A-A line of FIG. 12A.

FIGS. 11, 12A and 12B show a fourth embodiment of the present invention. Different to the third embodiment, the rib-like raiser 141 of the fourth embodiment is disposed on the bond pad 120. The UBM layer 142 covers the raiser 141 and is electrically connected to the bond pad 120, the bonding layer 143 covers the UBM layer 142 and is electrically connected to the UBM layer 142. In the fourth embodiment, the raiser 141 is across the opening 131 as shown in FIG. 12B, and preferably, the raisers 141 of the adjacent composite bumps 140 are connected with each other and become a raising strip formed as one piece.

Figure 13:
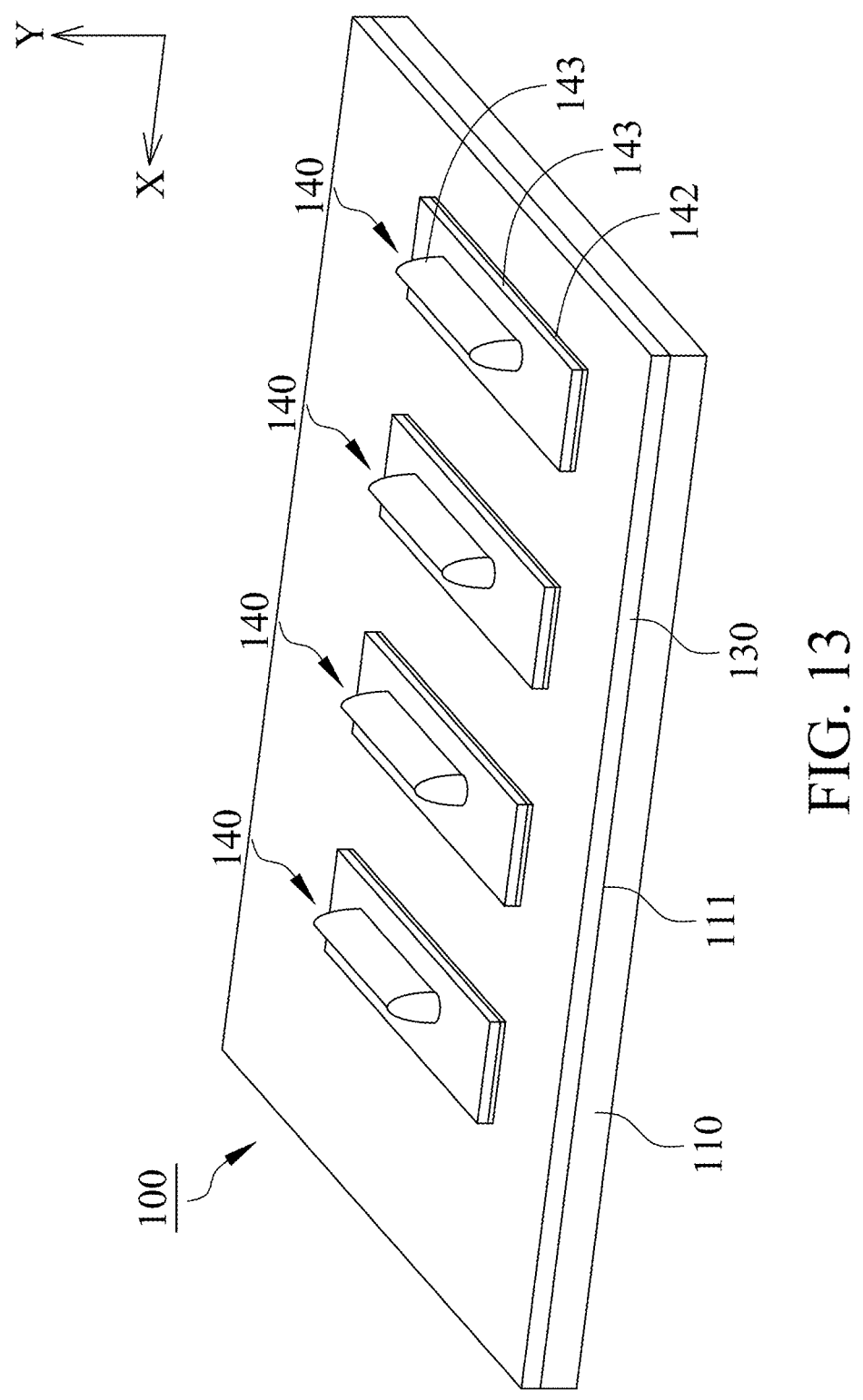
FIG. 13 is a perspective diagram illustrating a chip in accordance with a fifth embodiment of the present invention.
Figure 14A:
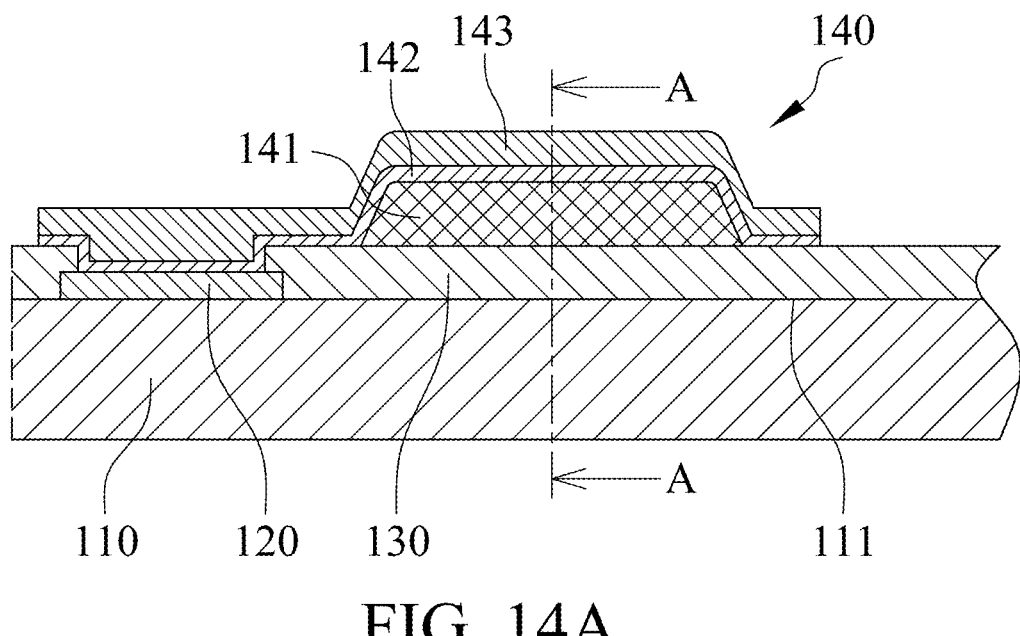
FIG. 14A is a cross-section view diagram of FIG. 13.
Figure 14B:
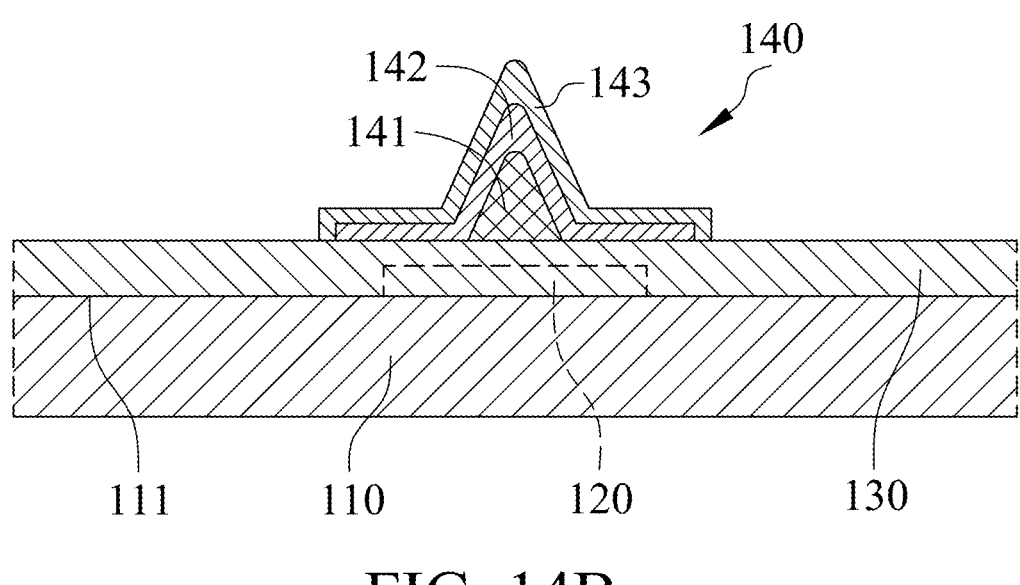
FIG. 14B is a cross-section view diagram along A-A line of FIG. 14A.

FIGS. 13, 14A and 14B represent a fifth embodiment of the present invention. Different to the third embodiment, the raiser 141 disposed on the protective layer 130 is extended toward the opening 131 of the protective layer 130 in the fifth embodiment, accordingly, the UBM layer 142 and the bonding layer 143 located on the raiser 141 are also extended toward the opening 131. The raiser 141 is fully covered by the UBM layer 142 located on the raiser 141, and the UBM layer 142 is fully covered by the bonding layer 143.

In the present invention, the raiser 141 of each of the composite bumps 140 is provided to distribute compressive stress in the chip 100 during the bonding process, and owing to the bonding surface 143b of the bonding layer 143 located above the raiser 141, which contacts the contact pad 210, has an area greater than that of the surface to be bonded 143a of the bonding layer 143 before the bonding process, the electrical impedance between the chip 100 and the substrate 200 can be reduced to ensure the effectiveness and reliability of the flip-chip package.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:
1. A flip chip bonding method comprising the steps of:
provide a substrate including a plurality of contact pads;
providing a chip including a body, a plurality of bond pads, a protective layer and a plurality of composite bumps, the plurality of bond pads are disposed on the body, the protective layer is configured to cover a surface of the body and includes a plurality of openings, each of the plurality of openings is configured to expose one of the plurality of bond pads, each of the plurality of composite bumps is electrically connected to one of the plurality of bond pads and includes a raiser, a under bump metallization (UBM) layer and a bonding layer, the raiser is non-conductive and covered by the UBM layer, the UBM layer is electrically connected to the plurality of bond pads and covered by the bonding layer, the bonding layer is electrically connected to the UBM layer, the bonding layer located above the raiser has a surface to be bonded which faces toward the substrate, wherein the raiser of each of the plurality of composite bumps is disposed on one of the plurality of bond pads, is a rib extended in a direction parallel to the surface of the body and is across one of the plurality of openings; and performing a bonding process, the plurality of composite bumps of the chip are bonded to the plurality of contact pads of the substrate, the substrate and the chip are configured to be pressed to allow the surface to be bonded of the bonding layer of each of the plurality of composite bumps to contact one of the plurality of contact pads such that the bonding layer has a bonding surface on each of the plurality of contact pads, and an area of the bonding surface is greater than an area of the surface to be bonded.

2. The flip chip bonding method in accordance with claim 1, wherein a non-conductive film (NCF) is provided between the substrate and the chip before the bonding process, the plurality of composite bumps are configured to penetrate through the NCF to allow the surface to be bonded of the bonding layer to contact the plurality of contact pads during the bonding process, the substrate and the chip are configured to be pressed continuously during the bonding process to allow the NCF to be filled between the substrate and the chip and cover the plurality of composite bumps.

3. The flip chip bonding method in accordance with claim 1, wherein the raiser and the plurality of composite bumps are pyramids or cones extended in a direction vertical to the body.

4. The flip chip bonding method in accordance with claim 1, wherein the raiser is a rib extended in a direction parallel to the surface of the body, each of the plurality of openings has a first width and the raiser has a second width which is greater than or equal to the first width, the UBM layer located on the raiser has a third width which is less than or equal to the second width.

5. The flip chip bonding method in accordance with claim 4, wherein a bonding rib is formed on the bonding layer located on the UBM layer and has a fourth width along the direction parallel to the surface of the body, the fourth width is greater than or equal to the third width of the UBM layer.

* * * * *